United States Patent
Shinohara et al.

(10) Patent No.: US 11,626,431 B2
(45) Date of Patent: Apr. 11, 2023

(54) PHOTOELECTRIC CONVERSION APPARATUS, SOLID-STATE IMAGE SENSOR AND DEVICE

(71) Applicant: CANON KABUSHIKI KAISHA, Tokyo (JP)

(72) Inventors: Mahito Shinohara, Tokyo (JP); Hiroshi Sekine, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/383,628

(22) Filed: Jul. 23, 2021

(65) Prior Publication Data

US 2022/0037380 A1    Feb. 3, 2022

(30) Foreign Application Priority Data

Jul. 29, 2020    (JP) .............................. JP2020-128505

(51) Int. Cl.
   *H01L 27/146*    (2006.01)
   *H04N 5/378*    (2011.01)

(52) U.S. Cl.
   CPC .... *H01L 27/1461* (2013.01); *H01L 27/14623* (2013.01); *H01L 27/14643* (2013.01); *H04N 5/378* (2013.01)

(58) Field of Classification Search
   CPC ........... H01L 27/1461; H01L 27/14623; H01L 27/14643; H01L 27/14603; H01L 27/14612; H04N 5/378
   See application file for complete search history.

(56) References Cited

U.S. PATENT DOCUMENTS

| | | |
|---|---|---|
| 4,962,412 A | 10/1990 | Shinohara et al. |
| 5,008,206 A | 4/1991 | Shinohara et al. |
| 5,060,042 A | 10/1991 | Shinohara et al. |
| 5,086,326 A | 2/1992 | Shinohara et al. |
| 6,828,601 B2 | 12/2004 | Shinohara |
| 6,876,019 B2 | 4/2005 | Shinohara |
| 7,250,970 B2 | 7/2007 | Shinohara |
| 7,394,492 B2 | 7/2008 | Shinohara |

(Continued)

FOREIGN PATENT DOCUMENTS

| | | |
|---|---|---|
| JP | 2011-249406 A | 12/2011 |
| JP | 2013-033885 A | 2/2013 |
| JP | 2013-179275 A | 9/2013 |

*Primary Examiner* — Gevell V Selby
(74) *Attorney, Agent, or Firm* — Venable LLP

(57) ABSTRACT

A photoelectric conversion apparatus comprises a first semiconductor region of a first conductivity type arranged between a first surface and a second surface, a second semiconductor region of the first conductivity type arranged between the first surface and the second surface and configured to accumulate a signal charge generated by incident light, a third semiconductor region of the first conductivity type arranged between the first surface and the second surface, a fourth semiconductor region of the first conductivity type arranged between the first surface and the second surface and in contact with the third semiconductor region, a first transfer electrode arranged on the first surface, a semiconductor region of the second conductivity type arranged between the third semiconductor region and the second surface, and a semiconductor region of the second conductivity type arranged between the fourth semiconductor region and the second surface.

20 Claims, 6 Drawing Sheets

(56) References Cited

U.S. PATENT DOCUMENTS

| | | | |
|---|---|---|---|
| 7,821,551 B2 | 10/2010 | Shinohara | |
| 8,164,668 B2 | 4/2012 | Iida et al. | |
| 8,872,949 B2 * | 10/2014 | Shinohara | H01L 27/1463 |
| | | | 348/308 |
| 8,896,734 B2 | 11/2014 | Shinohara | |
| 8,970,769 B2 | 3/2015 | Shinohara et al. | |
| 9,293,503 B2 | 3/2016 | Sakano et al. | |
| 9,437,647 B2 | 9/2016 | Shinohara | |
| 9,653,514 B2 | 5/2017 | Tachino et al. | |
| 10,186,532 B2 | 1/2019 | Kobayashi et al. | |
| 10,483,307 B2 | 11/2019 | Sekine et al. | |
| 10,535,688 B2 | 1/2020 | Onuki et al. | |
| 10,645,322 B2 | 5/2020 | Sekine | |
| 10,714,515 B2 | 7/2020 | Shinohara | |
| 10,771,720 B2 | 9/2020 | Shinohara | |
| 10,805,563 B2 | 10/2020 | Ikeda et al. | |
| 10,818,724 B2 | 10/2020 | Shinohara | |
| 10,848,695 B2 | 11/2020 | Miki et al. | |
| 11,056,520 B2 | 7/2021 | Onuki et al. | |
| 2016/0071893 A1 | 3/2016 | Shinohara | |
| 2019/0333962 A1 * | 10/2019 | He | H01L 27/14689 |
| 2020/0252570 A1 | 8/2020 | Sekine et al. | |
| 2020/0275039 A1 | 8/2020 | Shinohara | |
| 2020/0366858 A1 * | 11/2020 | Shinohara | H04N 5/369 |

* cited by examiner

PHOTOELECTRIC CONVERSION APPARATUS, SOLID-STATE IMAGE SENSOR AND DEVICE

BACKGROUND OF THE INVENTION

Field of the Invention

The present invention relates to a photoelectric conversion apparatus, a solid-state image sensor, and a device.

Description of the Related Art

There is a sensor that has a global shutter function. A plurality of pixels each including a photoelectric conversion apparatus are arrayed in such a sensor. A photoelectric conversion apparatus included in each pixel can include a photodiode portion (to be referred to as a "PD portion" hereinafter), a memory portion, and a gate electrode that transfers signal charges accumulated in the PD portion to the memory portion. The sensor having the global shutter function can end the signal accumulation and start the next frame's signal accumulation at the PD by transferring signal charges from the PD portions to the corresponding memory portions simultaneously in all pixels. The global shutter function means the simultaneous signal accumulation operation as a result. Japanese Patent Laid-Open No. 2011-249406 discloses an arrangement of the global shutter sensor. Japanese Patent Laid-Open No. 2011-249406 discloses that a potential barrier region with a high impurity concentration of a first conductivity type is arranged on the lower side of a charge storage region at a memory portion of a second conductivity type to block a pseudo signal from flowing into the charge storage region.

The inflow of a pseudo signal can be reduced more when the region, of the memory portion, which can capture the charge is narrow. Hence, a potential barrier region tends to be formed at a high concentration in a shallow position. When the potential barrier region is formed at a high concentration, the extension of a depletion layer from the charge storage region will be small, and it will be possible to suppress the region to which a pseudo signal can flow to a narrow range.

However, in such a structure, when a transfer gate electrode is turned on, the charge storage region tends to shift from a buried state to a surface state, so that the signal charges transferred from the PD portion will be in contact with the semiconductor interface, where many trap levels are present. If signal carriers are assumed to be electrons, the electrons will be captured in the trap levels. When the gate electrode is turned off, holes are accumulated in the semiconductor interface. This causes the captured electrons recombine with the holes, thus causing the signal electrons to disappear. This can result in signal loss.

SUMMARY OF THE INVENTION

Accordingly, the present invention is conceived as a response to the above-described disadvantages of the conventional art.

According to one aspect of the present invention, there is provided a photoelectric conversion apparatus comprising a first semiconductor region of a first conductivity type arranged between a first surface and a second surface, a second semiconductor region of the first conductivity type arranged between the first surface and the second surface and configured to accumulate a signal charge generated by incident light, a third semiconductor region of the first conductivity type arranged between the first surface and the second surface, a fourth semiconductor region of the first conductivity type arranged between the first surface and the second surface and is in contact with the third semiconductor region, a fifth semiconductor region of a second conductivity type arranged between the fourth semiconductor region and the first surface, a first transfer electrode arranged on the first surface and configured to form, in the first semiconductor region, a channel for transferring the signal charge accumulated in the second semiconductor region to the third semiconductor region, a sixth semiconductor region of the second conductivity type arranged between the third semiconductor region and the second surface, and a seventh semiconductor region (20) of the second conductivity type arranged between the fourth semiconductor region and the second surface, wherein the third semiconductor region overlaps at least a part of the first transfer electrode and at least a part of the sixth semiconductor region in a planar view, the sixth semiconductor region and the seventh semiconductor region are electrically connected to each other, an effective amount of dopant ions per unit area for the seventh semiconductor region is greater than an effective amount of dopant ions per unit area for forming the sixth semiconductor region, and a depth from the first surface of a position where the seventh semiconductor region is arranged is not less than that of the sixth semiconductor region.

Further features of the present invention will become apparent from the following description of exemplary embodiments with reference to the attached drawings.

DESCRIPTION OF THE EMBODIMENTS

Figure 1:
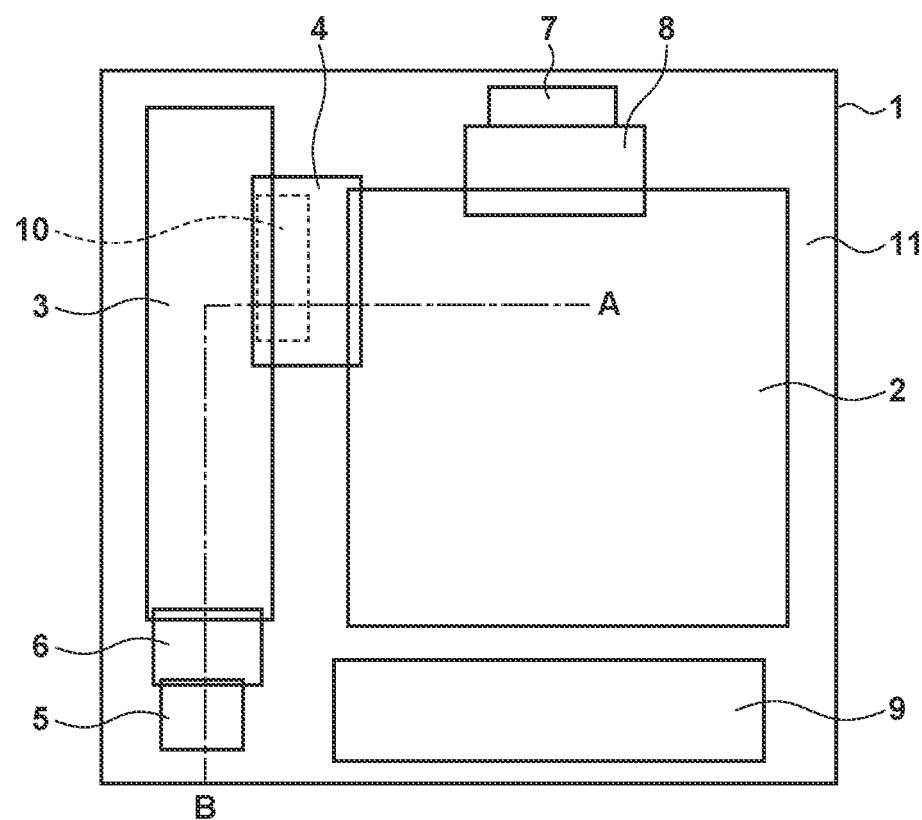
FIG. 1 is a plan view of a photoelectric conversion apparatus according to an embodiment.

Hereinafter, embodiments will be described in detail with reference to the attached drawings. Note, the following embodiments are not intended to limit the scope of the claimed invention, and limitation is not made to an invention that requires a combination of all features described in the embodiments. Two or more of the multiple features described in the embodiments may be combined as appropriate. Furthermore, the same reference numerals are given to the same or similar configurations, and redundant description thereof is omitted.

In embodiments hereinafter, assume that a signal carrier is an electron, the conductivity type of a signal accumulation layer is n-type, and a transistor forming a circuit is an n-type MOS transistor unless otherwise stated. However, the signal carrier may be assumed to be a hole, and the n-type conductivity may be switched to a p-type conductivity.

First Embodiment

A photoelectric conversion apparatus according to this embodiment will be described. The photoelectric conversion apparatus can include a PD portion, a memory portion, and a PD signal transfer portion for transferring signal charges accumulated in the PD portion. The photoelectric conversion apparatus can also include a memory signal transfer portion that transfers the signal charges from the memory portion to a floating diffusion region (to be referred to as an "FD portion" hereinafter) and an amplification MOS transistor that amplifies and outputs the signal charges. When a global shutter operation is to be performed, the signal charges accumulated in the PD portions are transferred all at once to the memory.

FIG. 1 is a plan view obtained when a semiconductor substrate including a photoelectric conversion apparatus 1 according to this embodiment is seen in a planar view, and shows a simplified layout of the photoelectric conversion apparatus 1. The photoelectric conversion apparatus 1 can include a photodiode (PD) portion 2, a memory portion 3 for storing signal charges, a transfer electrode 4 for transferring the signal charges from the PD portion 2 to the memory portion 3, an FD portion 5, and a transfer electrode 6 for transferring the signal charges stored in the memory portion 3 to the FD portion 5. The photoelectric conversion apparatus 1 can also include an overflow drain (to be referred to as an "OFD" hereinafter) 7 for discharging signal charges to reset the PD portion 2, and a transfer electrode 8 for transferring the signal charges accumulated in the PD portion 2 to the OFD 7. The photoelectric conversion apparatus 1 can also include a MOS transistor portion 9 that includes a MOS transistor and the like for amplifying and reading out the signal charges transferred to the FD portion 5.

An n-type semiconductor region 10 which is in contact with an n-type semiconductor region of the memory portion 3 and is formed near a semiconductor interface is arranged below the transfer electrode 4. The photoelectric conversion apparatus 1 can also include an element isolation portion 11 which is used for element isolation and is formed by, for example, a diffusion layer semiconductor or an oxide film such as shallow trench isolation (STI) or the like.

The transfer electrode 4, the transfer electrode 6, and the transfer electrode 8 can be arranged on the surface of the semiconductor substrate on which the PD portion 2 and the memory portion 3 are formed. In a planar view, the n-type semiconductor region 10 is arranged so as to at least partially overlap the transfer electrode 4.

The MOS transistor portion 9 can include a plurality of MOS transistors such as a MOS transistor for signal amplification, a reset MOS transistor for resetting the FD portion, and the like. A light-shielding membrane can be arranged on the memory portion 3 to reduce light that enters the memory portion or to prevent light from entering the memory portion. For example, tungsten or the like can be used as the light-shielding membrane.

Figure 2:
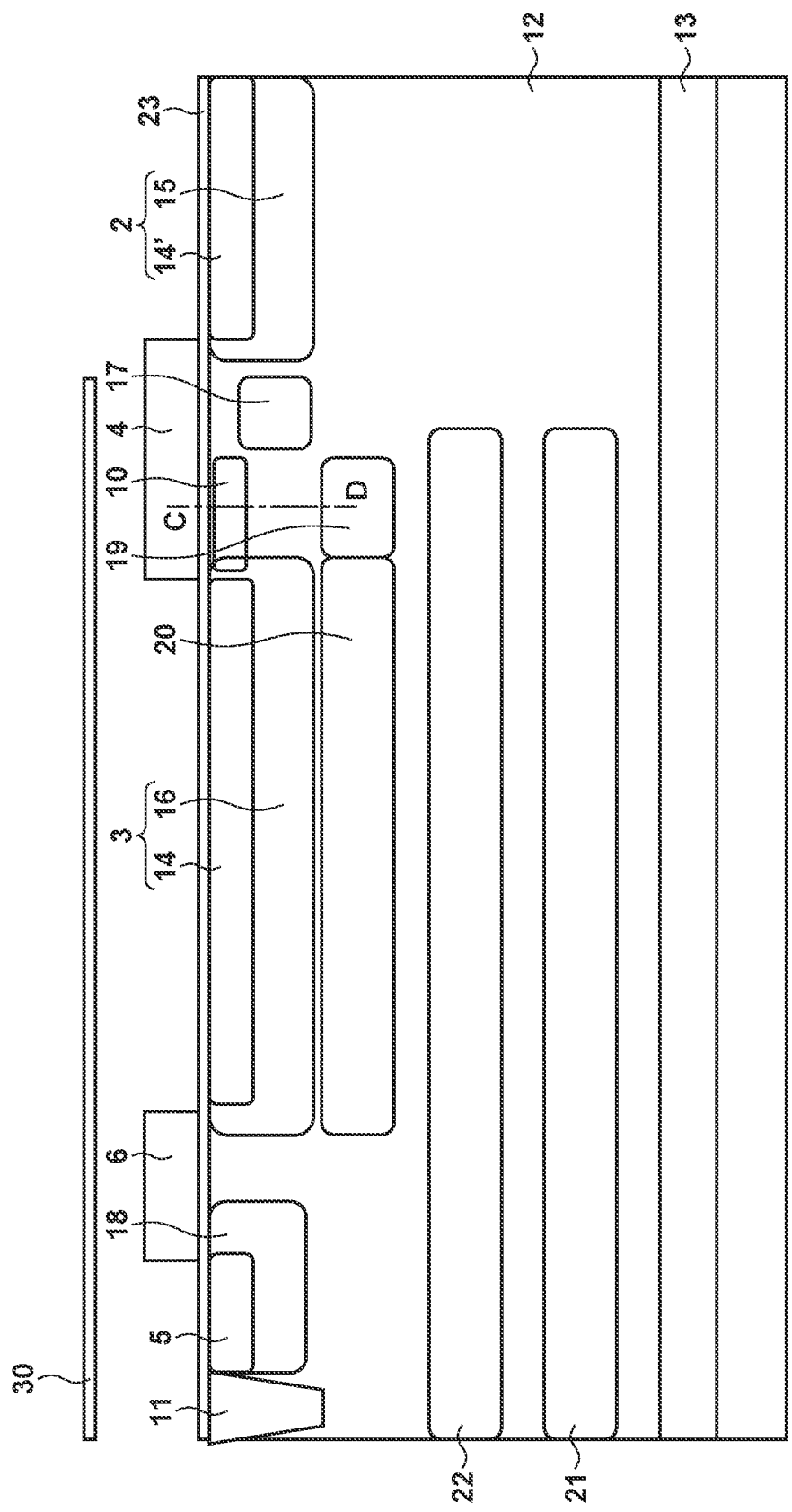
FIG. 2 is a sectional view of the photoelectric conversion apparatus.

FIG. 2 is a sectional view taken along a line A to B indicated by an alternate long and short dashed line in FIG. 1. This example shows an example in which semiconductor regions that have respective functions are arranged in an n-type semiconductor region 12 with a low impurity concentration. An n-type semiconductor region 15 can accumulate signal charges generated from incident light. A p-type semiconductor region 13 overlaps the n-type semiconductor region 15 in a planar view and determines the sensitivity of the PD portion 2. In addition, the p-type semiconductor region 13 can be electrically connected to a p-type semiconductor region 19 via p-type semiconductor regions 21 and 22 which are arranged between the p-type semiconductor region 19 and the p-type semiconductor region 13. P-type semiconductor regions 14 and 14' with a high impurity concentration are formed on the semiconductor interfaces of the memory portion 3 and the PD portion 2, respectively. The PD portion 2 includes the p-type semiconductor region 14', the n-type semiconductor region 15, and an n-type semiconductor region which is immediately below the n-type semiconductor region 15 and extends to the depth of the p-type semiconductor region 13. In addition, an n-type semiconductor region 16 can store the signal charges transferred from the n-type semiconductor region 15. The memory portion 3 can include the p-type semiconductor region 14 and the n-type semiconductor region 16. The PD portion 2 and the memory portion 3 both are buried structures.

The p-type semiconductor region 17 can also electrically isolate the n-type semiconductor region 15 and the n-type semiconductor region 10. The p-type semiconductor region 17 is positioned below the transfer electrode 4 and at least partially overlaps the transfer electrode 4 in a planar view. A p-type semiconductor region 18 can electrically isolate the n-type semiconductor region 16 and the FD portion 5 which serves as an n-type semiconductor region. The p-type semiconductor region 19 is below the n-type semiconductor region 10, at least partially overlaps the n-type semiconductor region 10 in a planar view, and is arranged so as not to overlap the n-type semiconductor region 16. A p-type semiconductor region 20 is arranged below the n-type semiconductor region 16 so as to at least partially overlap the n-type semiconductor region 16 in a planar view. The p-type semiconductor regions 19 and 20 can prevent the signal charges, generated in the PD portion due to incident light entering the PD portion 2, from diffusing and flowing into the n-type semiconductor region 10 and the n-type semiconductor region 16. Both the p-type semiconductor regions 21 and 22 are regions for isolating the PD portions of adjacent photoelectric conversion apparatuses. That is, in a planar view of the isolation portion of the photoelectric conversion apparatus, the memory portion 3 and the FD portion 5 will at least partially overlap each other.

A thin dielectric film 23 is formed on the semiconductor interface. The transfer electrodes 4, 6, and 8 and a gate electrode of a MOS transistor are formed on the thin dielectric film 23. A light-shielding membrane 30 can be arranged on the memory portion 3 (in a direction toward the transfer electrodes 4 and 6 with respect to the thin dielectric film 23 in FIG. 2) to reduce the light into the memory portion 3 or prevent the light from entering the memory portion 3. The light-shielding membrane 30 can be arranged to cover regions other than the PD portion 2.

Figure 3:
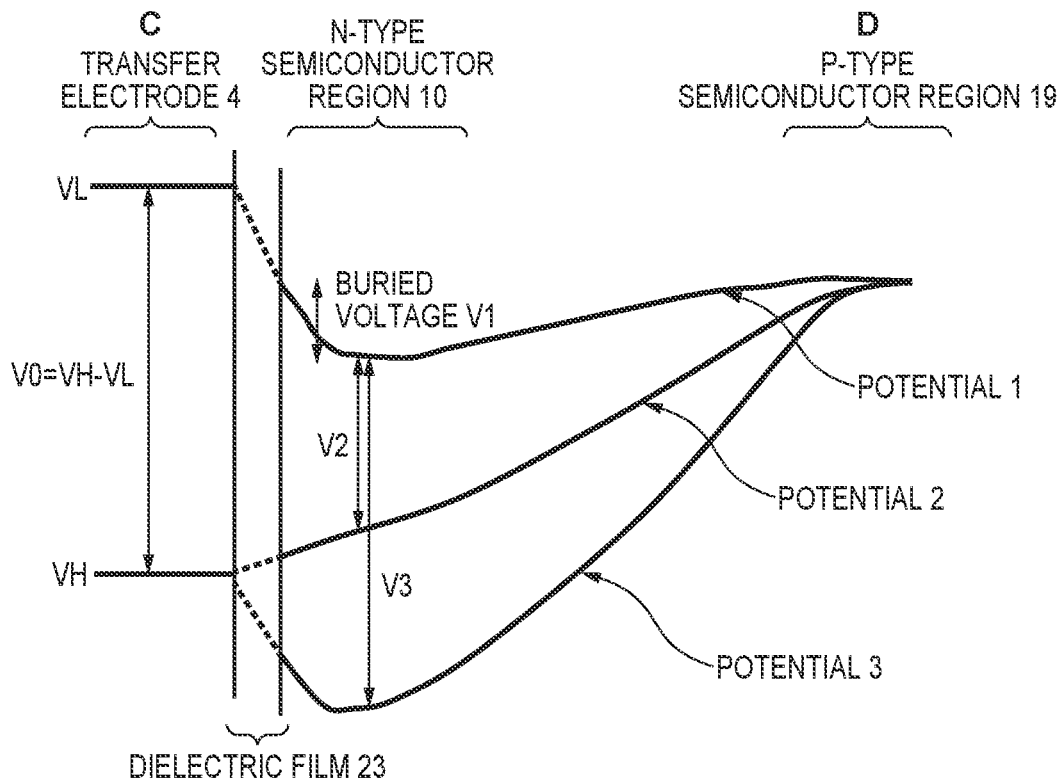
FIG. 3 is a view showing potentials during an operation.

A potential change due to a change in the potential of the transfer electrode 4 when signal charges are transferred from the n-type semiconductor region 15 to the n-type semiconductor region 10 will be described next. FIG. 3 is a view of the electric potential of a section taken along a line C to D indicated by an alternate long and short dashed line below the transfer electrode 4 in FIG. 2. That is, FIG. 3 shows potential profiles the sections of the n-type semiconductor regions between the transfer electrode 4, the dielectric film 23, the n-type semiconductor region 10, and the p-type semiconductor region 19. In FIG. 3, the plus and minus voltages indicate downwards and upwards respectively. A channel is formed in accordance with the potential of the transfer electrode 4. When the potential of the transfer electrode 4 is VL, the channel is set to an OFF state, and when the potential of the transfer electrode 4 is VH, the channel is set to an ON state. In the ON state, signal charges are transferred from the n-type semiconductor region 15 to the n-type semiconductor region 10.

A line indicated by potential 1 is a potential profile obtained when the potential of the transfer electrode 4 is VL. Assume here that a buried voltage V1 refers to a potential difference between the lowest point of the potential indicated by potential 1 and the semiconductor interface or a neutral region of the p-type semiconductor region 19. Since the semiconductor interface is in a pinning state, that is, a state that attracts holes, it will have a potential similar to the neutral region of the p-type semiconductor region 19. Assume that Qe·V1 is sufficiently greater than k·T, where Qe is an electron charge, k is the Boltzmann constant, and T is an absolute temperature. That is, even if signal charges are present at the bottom of potential 1 of the n-type semiconductor region 10, it can be assumed that the electrons are in a state in which they will hardly be thermally excited to the semiconductor interface.

A line indicated by potential 2 represents a state in which the buried state has disappeared when the potential of the transfer electrode 4 is VH. A line indicated by potential 3 represents a state in which the buried state has been sufficiently maintained when the potential of the transfer electrode 4 is VH. In the case of potential 2, since signal charges (electrons in this example) transferred from the n-type semiconductor region 15 will accumulate in the semiconductor interface, the electrons can be captured easily in trap levels of the interface. On the other hand, in the case of potential 3, the electrons transferred from the n-type semiconductor region 15 will hardly be thermally excited to the semiconductor interface because the buried state is maintained. Hence, the electrons will hardly be captured in the trap levels of the interface.

When the potential of the transfer electrode 4 returns again to VL, holes are induced in the semiconductor interface of the n-type semiconductor region 10, and many of the electrons captured in the semiconductor interface will disappear upon recombining with the holes. That is, if the state indicated by potential 2 is set when the transfer electrode 4 is set to ON, at least some of the signal charges transferred from the n-type semiconductor region 15 will disappear. However, since the buried state is maintained in the state indicated by potential 3, the signal charges will hardly disappear, and almost all of the signal charges can be transferred to the n-type semiconductor region 16.

The cause of the difference between the state of potential 2 and the state of potential 3 described above will be described hereinafter. Assume that "capacitance" refers to the capacitance per unit area hereinafter. Let V0 be an amount of potential change of the transfer electrode 4 when the potential of the transfer electrode 4 changes from VL to VH. Let V2 be an amount of potential change of the n-type semiconductor region 10 when the potential changes in the manner of potential 2. Let V3 be an amount of potential change when the potential of the n-type semiconductor region 10 changes in the manner of potential 3.

A capacitance between the transfer electrode 4 and the semiconductor interface immediately below it is a capacitance formed by the dielectric film 23 and will be referred to as C0. Assume that charges are accumulated at the lowest point of the potential of the n-type semiconductor region 10, and that a capacitance between this lowest point and the semiconductor interface will be referred to as C1. Since C0 and C1 are connected in series, a capacitance between the transfer electrode 4 and the n-type semiconductor region 10 is C0·C1/(C0+C1). This capacitance will be referred to as C01. Let C2 be a p-n junction capacitance between the n-type semiconductor region 10 and the p-type semiconductor region 19. In this case, the potential of the n-type semiconductor region 10 when the potential of the transfer electrode 4 is to change from VL to VH will change in response to the potential change of the transfer electrode 4. Since the voltage to be applied to each of the capacitance C01 and the p-n junction capacitance C2 will be divided in accordance with the capacitance, the voltage of semiconductor region 10 will change by C01/(C01+C2)×V0 corresponding to the amount of voltage applied to the capacitance C2. Here, V0=VH−VL.

If the voltage change in accordance with the potential change of the transfer electrode 4 is small like V2, it will make the buried state disappear because the potential of the n-type semiconductor region 10 will become lower than the potential of the transfer electrode 4. If the voltage that decreases in accordance with the potential change of the transfer electrode 4 is large like V3, the buried state will be maintained because the potential of the n-type semiconductor region 10 will become lower than the potential of the transfer electrode 4.

That is, if a voltage division ratio C01/(C01+C2) based on the capacitance is small, a state as shown by potential 2 can be set. If the voltage division ratio C01/(C01+C2) based on the capacitance is large and is closer to 1, a state as shown by potential 3 can be set. Since V3=V0 is set when the voltage division ratio based on the capacitance is 1, the buried voltage V1 can be maintained even when the transfer electrode 4 is set to ON. Depending on the value of the capacitance C2, the buried state can be maintained even when the transfer electrode 4 is set to ON. However, the buried voltage will not be sufficient, and signal charges may disappear to a certain extent. Hence, the smaller the capacitance C2, the buried state of the n-type semiconductor region 10 can be more sufficiently maintained.

C2=0 is ideal from the point of view of preventing the disappearance of signal charges. However, if the distance between the n-type semiconductor region 10 and the p-type semiconductor region 19 is increased to reduce the capacitance C2, that is, if a p-type semiconductor region is formed in a deep position, the possibility of a pseudo signal inflow will increase, thus increasing the possibility that a pseudo signal will mix into the memory portion.

Hence, to reduce the disappearance of signal charges by sufficiently maintaining the buried state of the n-type semiconductor region 10 while preventing the inflow of a pseudo signal, it can be made to form the p-type semiconductor region 19 in a shallow position and set an appropriate impurity concentration in the p-type semiconductor region 19. That is, when the transfer electrode 4 is set to OFF, most of the p-type semiconductor region 19 is set to a neutral region. While when the transfer electrode 4 is set to ON, most of the p-type semiconductor region 19 is depleted. Depleting the most of the p-type semiconductor region 19 will set the capacitance C2 to a value close to zero, and the voltage division ratio C01/(C01+C2) based on the capacitance can be set to a value close to 1. At this time, the buried state of the n-type semiconductor region 10 can be sufficiently maintained as shown by potential 3. The impurity concentration of the p-type semiconductor region 19 that satisfies such a condition will be obtained.

Figure 4:
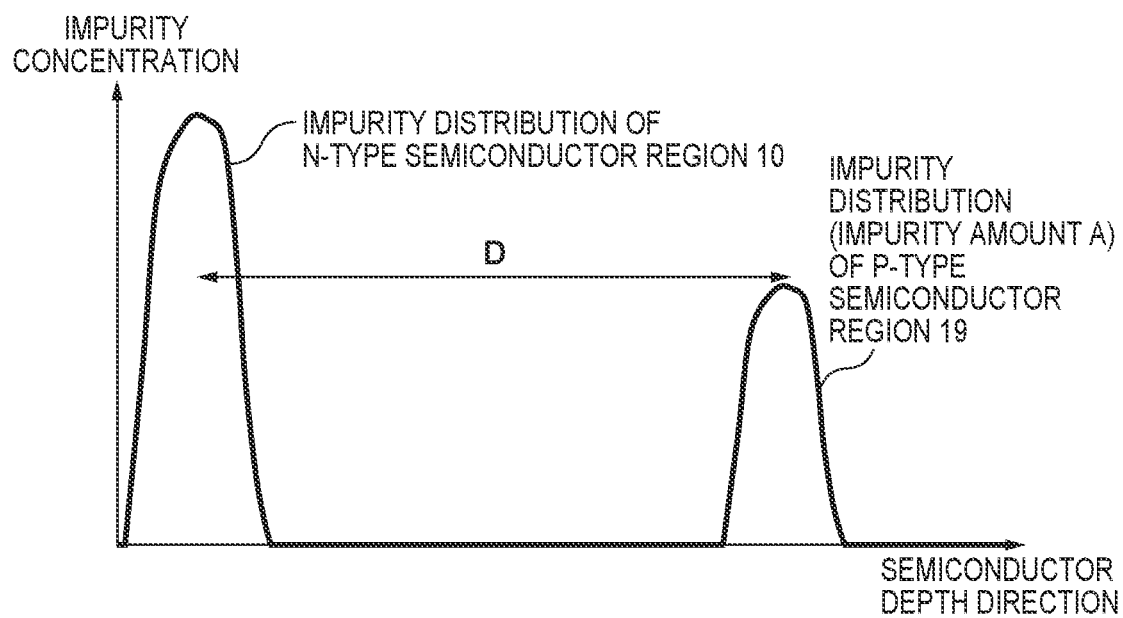
FIG. 4 is a graph showing the profile of an impurity concentration.

The relationship between the n-type semiconductor region 10 and the p-type semiconductor region 19 will be described with reference to FIG. 4. As a premise for obtaining the condition, assume that D is a distance between the n-type semiconductor region 10 and the p-type semiconductor region 19 and that the impurity distribution width of the n-type semiconductor region 10 and the impurity distribution width the p-type semiconductor region 19 are sufficiently smaller than the distance D. Assume also that the impurity concentration of the semiconductor region between the n-type semiconductor region 10 and the p-type semiconductor region 19 is sufficiently lower than the impurity concentration of the n-type semiconductor region 10 and the impurity concentration of the p-type semiconductor region 19.

Assume that Vbi is a built-in potential generated between the n-type semiconductor region 10 and the p-type semiconductor region 19 and e is a dielectric constant of a semiconductor. Assume also that A is an amount of impurities (number of acceptor ions) per unit area of the p-type semiconductor region 19.

As described above, if the p-type semiconductor region 19 has not been depleted, a capacitance $C2=\varepsilon/D$ will be formed between the n-type semiconductor region 10 and the p-type semiconductor region 19, and a charge $\Delta Q$ which is induced when the voltage between the n-type semiconductor region 10 and the p-type semiconductor region 19 changes to $\Delta V$ will be expressed as follows.

$$\Delta Q=(\varepsilon/D)\times\Delta V \quad (1)$$

According to equation (1), the amount of charges of the p-type semiconductor region 19 when the transfer electrode 4 is set to OFF is $(\varepsilon/D)\times(Vbi+V1)$. At this time, ½ or more of the impurities of the p-type semiconductor region 19 have become neutralized. That is, assuming that holes in an amount equal to or more than ½×A are present in the p-type semiconductor region 19, $$½\times Qe\times A \geq (\varepsilon/D)\times(Vbi+V1)$$

will be established.

In addition, if $C01/(C01+C2)$ is set to be about 0.9 by assuming that the p-type semiconductor region 19 will be completely depleted by the time the potential of the transfer electrode 4 has changed from VL to VH, the charge amount of the capacitance C2 can be established as $$Qe\times A \leq (\varepsilon/D)\times(Vbi+V1+0.9\times V0)$$

In sum, the following is established.

$$2\times(\varepsilon/D/Qe)\times(Vbi+V1) \leq A \leq (\varepsilon/D/Qe)\times(Vbi+V1+0.9\times V0) \quad (2)$$

Assuming that the semiconductor is silicon, it is preferable to set D to be 0.3 μm to 0.5 μm. Vbi is approximately 0.7 V. V1 can be set 1.4 V to 2.4 V and V0 can be set 4 V to 6.5 V. When the upper limit and the lower limit of A, that is, the amount of acceptor ions to be implanted to form the p-type semiconductor region 19, are obtained in accordance with such ranges, it was found that A can be $5.5\times10^{11}/cm^2$ or more and $1.2\times10^{12}/cm^2$ or less.

It will be difficult to both suppress a pseudo signal and prevent signal loss if the value of A falls outside this condition. However, the value of A represents an effective amount. When donor ions are present by only an amount B in the position of the p-type semiconductor region 19, an amount obtained by subtracting B from the amount of acceptor ions introduced for the formation of the p-type semiconductor region 19 will be the effective amount of acceptor ions. Hence, an effective amount of impurities (effective amount of dopant ions) to be doped per unit area will be $5.5\times10^{11}/cm^2$ or more and $1.2\times10^{12}/cm^2$ or less.

Note that although the p-type semiconductor region 20 has, in a manner similar to the p-type semiconductor region 19, the role of preventing a pseudo signal from mixing into the memory portion 3, it also has the role of increasing a saturation signal amount in the memory portion 3 by forming a p-n junction capacitance with the n-type semiconductor region 16. Hence, the p-type semiconductor region 20 can be formed independently of the p-type semiconductor region 19 and be electrically connected to the p-type semiconductor region 19. In addition, the effective amount of dopant ions for forming the p-type semiconductor region 20 may be larger than that of A described above. Furthermore, since the n-type semiconductor region 16 will be formed to a position deeper than the n-type semiconductor region 10, the p-type semiconductor region 20 can have a depth similar to that of the p-type semiconductor region 19 or be formed at a deeper position.

In this example, the p-type semiconductor region 19 is completely depleted when the potential of the transfer electrode 4 is VH. However, at such a time, the p-type semiconductor region will lose its potential barrier function, and a state in which some of the signal charges generated in the PD portion 2 directly will move to the n-type semiconductor region 10 can occur. Yet, since the time when the potential of the transfer electrode 4 changes to VH is the time of the signal transfer operation from the PD portion 2 to the memory portion 3, the direct movement of signal charges during this operation is not the mixing of a pseudo signal, but a normal operation. Thus, this movement is not a problem at all.

On the other hand, during the signal transfer operation from the PD portion 2 to the memory portion 3, the potential of the n-type semiconductor region 10 will also increase as the potential of the transfer electrode 4 increases as shown by potential 3 of FIG. 3. This will create a large potential difference between the n-type semiconductor region 10 and the n-type semiconductor region 15 which is the signal accumulation layer of the PD portion 2, and a charge signal (electrons) accumulated in the n-type semiconductor region 15 will immediately be transferred to the n-type semiconductor region 10. When the potential of the transfer electrode 4 returns to VL, the signal charges of the n-type semiconductor region 10 will move to the n-type semiconductor region 16 and be stored there. Since signal transfer from the PD portion 2 to the memory portion 3 can be performed easily in this manner, the saturation signal amount of the PD portion 2 can be increased.

According to the photoelectric conversion apparatus structure described above, signal loss can be reduced while suppressing a pseudo signal from mixing into the memory portion more effectively than the related art. In addition, the saturation signal amount of the PD portion 2 can also be improved.

Modification of First Embodiment

Figure 5:
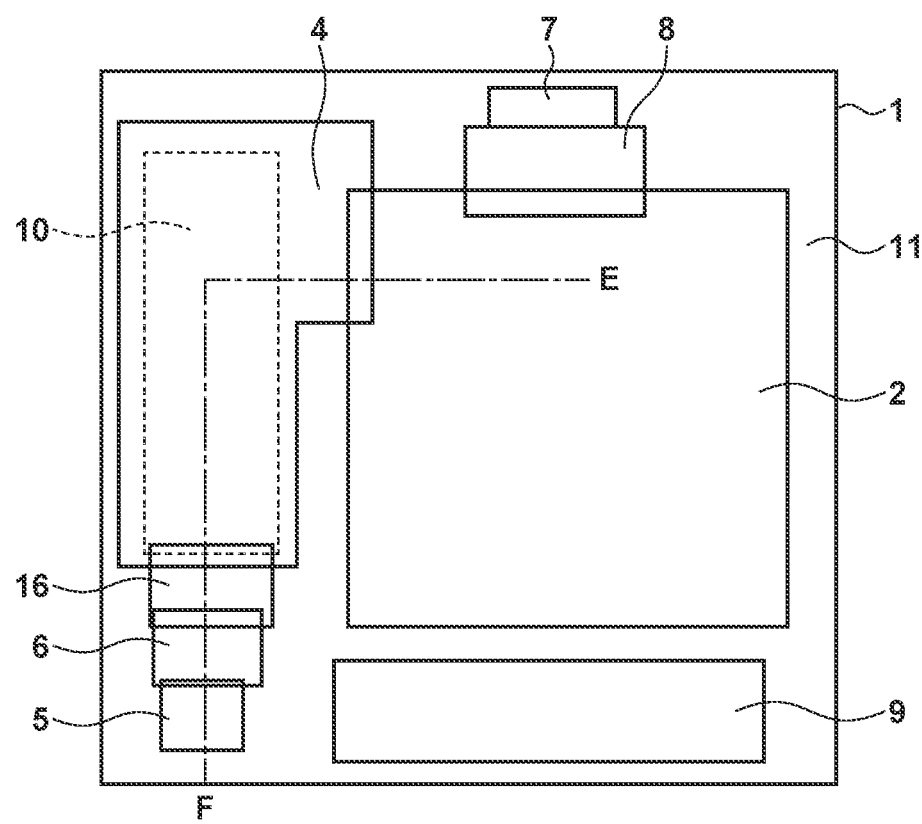
FIG. 5 is a plan view of a modification of the photoelectric conversion apparatus.
Figure 6:
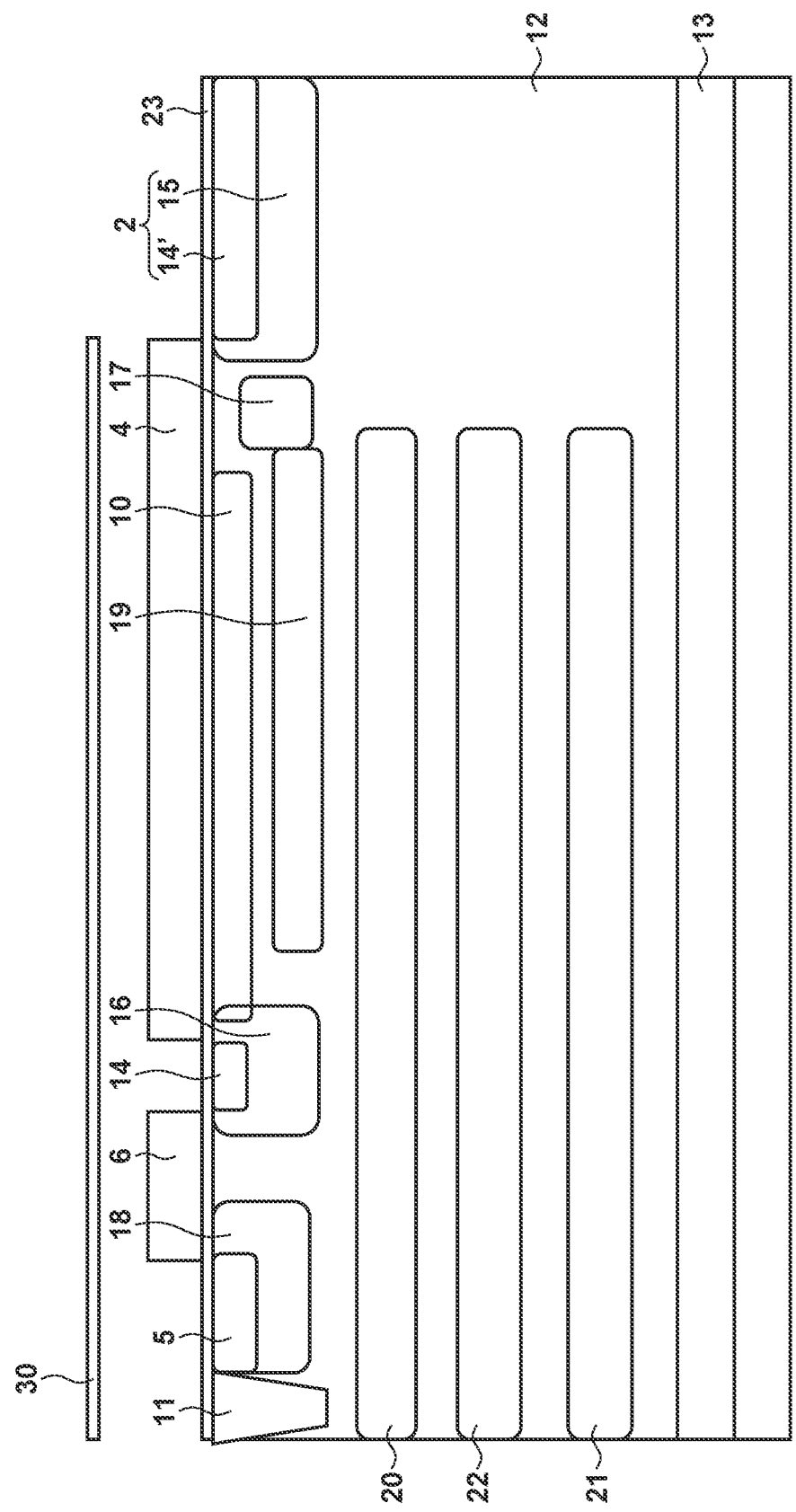
FIG. 6 is a sectional view of the modification of the photoelectric conversion apparatus.

The photoelectric conversion apparatus 1 according to the modification of the first embodiment will be described with reference to FIG. 5 which is a plan view obtained when the semiconductor substrate is seen in a planar view. FIG. 6 shows a sectional structure view taken along a line E to F indicated by an alternate long and short dashed line in FIG. 5. In this modification, the area of the transfer electrode 4 and the area of the n-type semiconductor region 10 formed in the semiconductor interface below the transfer electrode 4 will be greater than the area of the n-type semiconductor region 16. The transfer electrode 4 and the transfer electrode 6 are close to each other, and the p-type semiconductor region 14 is formed under the semiconductor interface between them. The space between the n-type semiconductor region 15 and the n-type semiconductor region 16 is larger than the space between the n-type semiconductor region 16 and the FD portion 5. In this example, the n-type semiconductor region 10 itself functions as a memory portion, and the n-type semiconductor region 16 acts more as a passageway for the signal charges to move from the n-type semiconductor region 10 to the FD portion 5 than as a memory as a charge storage portion. Since the n-type semiconductor region 16 has a small area and acts minimally as a memory, the concentration of the p-type semiconductor region 20 below the n-type semiconductor region 16 suffices to be low. The p-type semiconductor region 20 may also be arranged in a position deeper than the p-type semiconductor region 19 and may be arranged in approximately the same depth as the p-type semiconductor region 19 in some cases. In addition, the p-type semiconductor region 13 can be electrically connected to the p-type semiconductor region 19 via the p-type semiconductor regions 20, 21, and 22, which are arranged between the p-type semiconductor region 13 and the p-type semiconductor region 19.

The fact that the p-type semiconductor region 20 is electrically connected to the p-type semiconductor region 19 and the fact that the p-type semiconductor region 20 is arranged at approximately the same position as or a deeper position than the p-type semiconductor region 19 are the same as the first embodiment. However, in this example, the relationship between the impurity concentration of the p-type semiconductor region 19 and the impurity concentration of the p-type semiconductor region 20 is not particularly specified. Hence, in a case in which the p-type semiconductor region 20 and the p-type semiconductor region 19 can be arranged at the same depth and have the same impurity concentration, the two regions can be combined to form a single p-type semiconductor region. For example, in a case in which the n-type semiconductor region 16 is to be arranged at a very shallow position, the p-type semiconductor region 20 and the p-type semiconductor region 19 can be formed as a single semiconductor region. Even in a case in which the p-type semiconductor region 14 and the n-type semiconductor region 16 are absent and the n-type semiconductor region 10 extends immediately below the transfer electrode 6, the p-type semiconductor region 20 and the p-type semiconductor region 19 can be formed as a single semiconductor region.

In addition, although the p-type semiconductor region 20 in FIG. 6 extends long and forms a part of the p-type semiconductor region for isolating the PD portions of adjacent photoelectric conversion apparatuses in a manner similar to the p-type semiconductor regions 21 and 22, it may not extend in such manner and may only partially overlap the p-type semiconductor region 19 in a planar view. Alternatively, the p-type semiconductor region 20 may be formed over the entire photoelectric conversion apparatus, or at least the n-type semiconductor region 15 in a planar manner, and act to increase the saturation of the PD portion 2 by forming a p-n junction capacitance with the n-type semiconductor region 15.

The saturation signal amount of the memory per unit area can be increased more in this modification than the first embodiment. This is because the MOS capacitance between the transfer electrode 4 and the n-type semiconductor region 10 is generally larger than the p-n junction capacitance formed by the p-type semiconductor region 14, the n-type semiconductor region 16, and the p-type semiconductor region 20. In addition, the n-type semiconductor region 10 can be maintained in the buried state when the potential of the transfer electrode 4 is VH. Therefore, according to this modification, it will be possible to also prevent signal loss in addition to more effectively preventing a pseudo signal from mixing into the memory portion, and it will also be possible to improve the saturation signal amount of the PD portion and the saturation signal amount of the memory.

[Solid-State Image Sensor]

Figure 7:
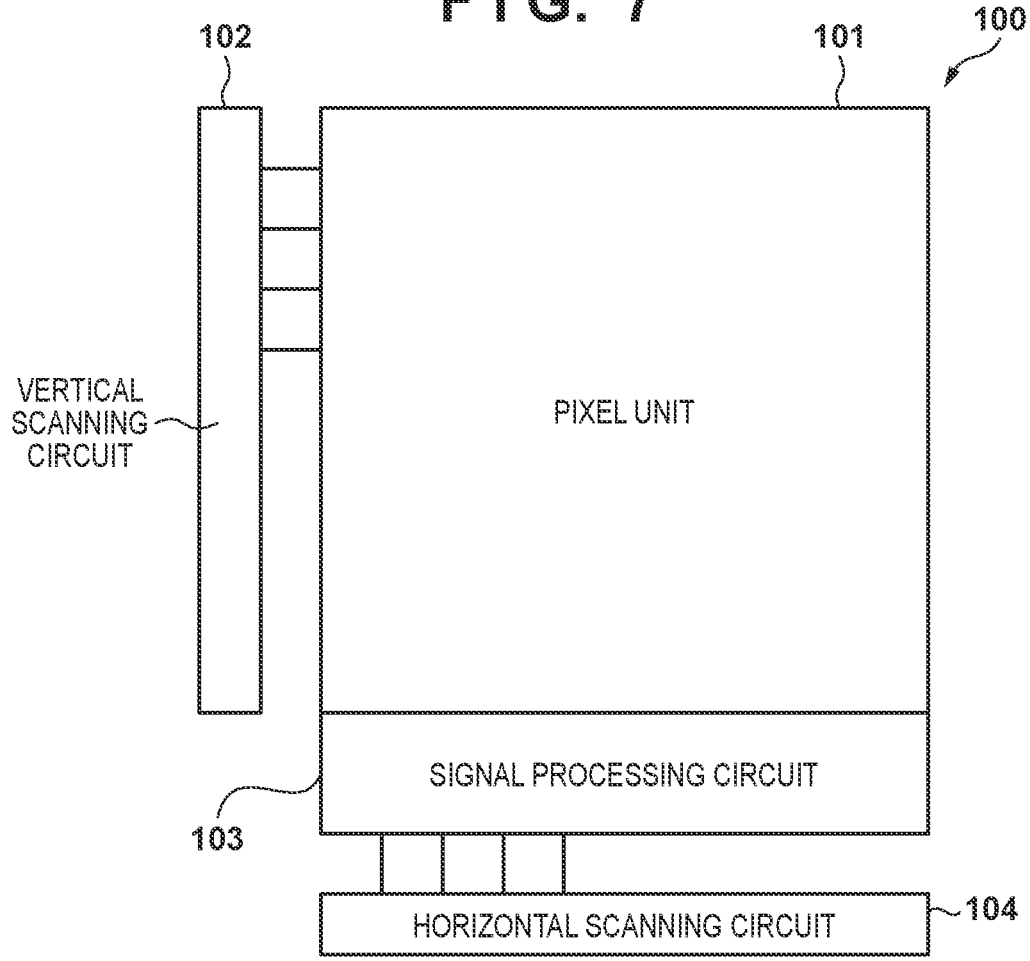
FIG. 7 is a plan view showing an outline of a solid-state image sensor.

An example in which the above-described photoelectric conversion apparatus is applied to a solid-state image sensor 100 will be described with reference to FIG. 7. The solid-state image sensor 100 includes, for example, a pixel unit 101 in which a plurality of pixels are arranged in a matrix, a vertical scanning circuit 102 that controls each row of pixels in the pixel unit 101, a signal processing circuit 103 that processes the signals read out from pixel unit 101, and a horizontal scanning circuit 104 that controls a circuit provided for each column. Each pixel includes the photoelectric conversion apparatus described in the first embodiment and the modification. The solid-state image sensor can also include a control circuit that generates a control signal and a timing signal for controlling the solid-state image sensor.

Typically, the vertical scanning circuit 102 will execute control to select a predetermined row of pixels and read out signals from the pixels of this selected row. Under the control of the vertical scanning circuit 102, a signal from the PD portion 2 of each photoelectric conversion apparatus will be output to a corresponding vertical signal line (not shown). The horizontal scanning circuit 104 will execute control to control the signal processing circuit 103 to output, to the outside, the signals read out on a row basis. The signal processing circuit 103 can include an amplification circuit for amplifying the signal from each pixel, a circuit for reducing noise, and an A/D converter.

For example, a global shutter operation is performed as follows. Under the control of the vertical scanning circuit 102, the PD portion 2 of each pixel included in the pixel unit 101 starts, at a predetermined timing, accumulating signal charges corresponding to incident light. Next, under the control of the vertical scanning circuit 102, the potential of the transfer electrode 4 of each photoelectric conversion apparatus is set to VH, and the signal charges accumulated in each PD portion 2 are transferred at the same timing to the corresponding semiconductor region used for accumulating the signal charges. The signal charges accumulated in each PD portion 2 can be read out at the same timing from the PD portion 2 in this manner. Next, the vertical scanning circuit 102 controls the transfer electrodes 6 of each row to transfer the signal charges to the respective FD portions 5. The signal from each FD portion 5 is amplified by the amplification circuit of the corresponding MOS transistor portion 9, and the amplified signal is output to the corresponding vertical signal line to be input to the signal processing circuit 103. The signal processing circuit 103 will, for example, amplify the signal, perform A/D conversion on the signal, and subsequently output, under the control of the horizontal scanning circuit 104, the signal to the outside.

Second Embodiment

Figure 8:
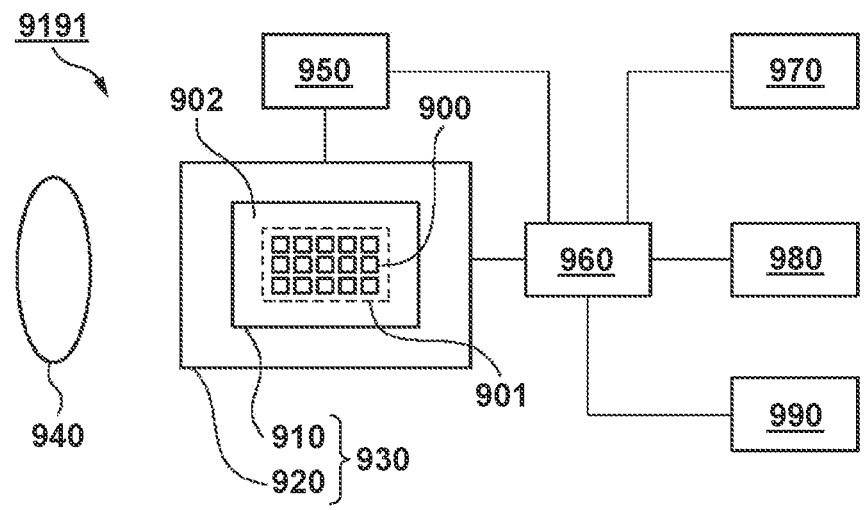
FIG. 8 is a view showing the arrangements of devices.

The second embodiment is also applicable to the first embodiment and the modification. FIG. 8 is a schematic view for explaining a device 9191 including a semiconductor apparatus 930 according to this embodiment. The device 9191 including the semiconductor apparatus 930 will be described in detail. The semiconductor apparatus 930 can include, in addition to a semiconductor device 910 which includes a semiconductor, a package 920 for containing the semiconductor device 910. The package 920 can include a base to which the semiconductor device 910 is fixed and a lid made of glass or the like facing the semiconductor device 910. The package 920 can further include a connection member such as a bonding wire and bump for connecting a terminal arranged in the base and a terminal arranged in the semiconductor device 910. The photoelectric conversion apparatus or the solid-state image sensor described in the first embodiment can be applied as the semiconductor device 910.

The device 9191 can include at least one of an optical apparatus 940, a control apparatus 950, a processing apparatus 960, a display apparatus 970, a storage apparatus 980, and a mechanical apparatus 990. The optical apparatus 940 corresponds to the semiconductor apparatus 930. The optical apparatus 940 can include, for example, a lens, a shutter, and a mirror. The control apparatus 950 controls the semiconductor apparatus 930. The control apparatus 950 is, for example, a semiconductor device such as an ASIC.

The processing apparatus 960 processes a signal output from the semiconductor apparatus 930. The processing apparatus 960 is a semiconductor device such as a CPU or ASIC for forming an AFE (Analog Front End) or a DFE (Digital Front End). The display apparatus 970 is an EL display apparatus or liquid crystal display apparatus that displays information (image) obtained by the semiconductor apparatus 930. The storage apparatus 980 is a magnetic device or semiconductor device that stores the information (image) obtained by the semiconductor apparatus 930. The storage apparatus 980 is a volatile memory such as an SRAM or DRAM or a nonvolatile memory such as a flash memory or hard disk drive.

The mechanical apparatus 990 includes a moving unit or a propulsion unit such as a motor or engine. In the device 9191, a signal output from the semiconductor apparatus 930 is displayed by the display apparatus 970 or transmitted to the outside by a communication apparatus (not shown) included in the device 9191. Hence, the device 9191 can further include the storage apparatus 980 and the processing apparatus 960, in addition to a storage circuit and an arithmetic circuit included in the semiconductor apparatus 930. The mechanical apparatus 990 may be controlled based on a signal output from the semiconductor apparatus 930.

In addition, the device 9191 is suitable for an electronic device such as an information terminal (for example, a smartphone or a wearable terminal) which has an imaging function, a camera (for example, an interchangeable lens camera, a compact camera, a video camera, or a monitoring camera), or the like. The mechanical apparatus 990 in the camera can drive the components of the optical apparatus 940 in order to perform zooming, an in-focus operation, and a shutter operation. Alternatively, the mechanical apparatus 990 in the camera can move the semiconductor apparatus 930 in order to perform an anti-vibration operation.

Furthermore, the device 9191 can be a transportation device such as a vehicle, a ship, an airplane, or the like. The mechanical apparatus 990 in a transportation device can be used as a moving apparatus. The device 9191 as a transportation device can be suitably used as a device for transporting the semiconductor apparatus 930 or a device that uses an imaging function to assist and/or automate driving (steering). The processing apparatus 960 for assisting and/or automating driving (steering) can perform, based on the information obtained by semiconductor apparatus 930, processing to operate the mechanical apparatus 990 as a moving apparatus. Alternatively, the device 9191 may be a medical device such as an endoscope or the like, a measurement device such as a range sensor or the like, an analysis device such as an electron microscope, an office device such as a copy machine or the like, or an industrial device such as a robot or the like.

According to the above-described embodiment, it is possible to obtain good pixel characteristics. Hence, the value of the semiconductor apparatus can be increased. This aforementioned "increase in the value" corresponds to at least one of addition of a function, improvement of performance, improvement of characteristics, improvement of reliability, improvement of production yield, reduction of an environmental load, cost reduction, size reduction, and weight reduction.

Therefore, using the semiconductor apparatus 930 according to this embodiment in the device 9191 will improve the value of the device. For example, by incorporating the semiconductor apparatus 930 in a transportation device, the transportation device will be able to have excellent performance when the outside imaging of the transportation device is to be performed or when the external environment is to be measured. Hence, in the producing and selling of transportation devices, determining to incorporate the semiconductor apparatus according to this embodiment in a transportation device will be advantageous in increasing the performance of the transportation device itself. In particular, the semiconductor apparatus 930 is suitable for a transportation device that uses information obtained by a semiconductor apparatus to perform driving support and/or automated driving of the transportation device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-128505, filed Jul. 29, 2020, which is hereby incorporated by reference herein in its entirety.

What is claimed is:
1. A photoelectric conversion apparatus comprising:
a first semiconductor region of a first conductivity type arranged between a first surface and a second surface;
a second semiconductor region of the first conductivity type arranged between the first surface and the second surface and configured to accumulate a signal charge generated by incident light;
a third semiconductor region of the first conductivity type arranged between the first surface and the second surface;
a fourth semiconductor region of the first conductivity type arranged between the first surface and the second surface and is in contact with the third semiconductor region;
a fifth semiconductor region of a second conductivity type arranged between the fourth semiconductor region and the first surface;
a first transfer electrode arranged on the first surface and configured to form, in the first semiconductor region, a channel for transferring the signal charge accumulated in the second semiconductor region to the third semiconductor region;

a sixth semiconductor region of the second conductivity type arranged between the third semiconductor region and the second surface; and
a seventh semiconductor region of the second conductivity type arranged between the fourth semiconductor region and the second surface,
wherein the third semiconductor region overlaps at least a part of the first transfer electrode and at least a part of the sixth semiconductor region in a planar view,
the sixth semiconductor region and the seventh semiconductor region are electrically connected to each other,
an effective amount of dopant ions per unit area for the seventh semiconductor region is greater than an effective amount of dopant ions per unit area for forming the sixth semiconductor region, and
a depth from the first surface of a position where the seventh semiconductor region is arranged is not less than that of the sixth semiconductor region.

2. The apparatus according to claim 1, wherein at least a part of the seventh semiconductor region overlaps the third semiconductor region in a planar view.

3. The apparatus according to claim 1, wherein the effective amount of dopant ions per unit area for forming the sixth semiconductor region is not less than $5.5 \times 10^{11}/cm^2$ and not more than $1.2 \times 10^{12}/cm^2$.

4. The apparatus according to claim 1, further comprising a light-shielding membrane arranged on the first surface and configured to cover the fourth semiconductor region.

5. The apparatus according to claim 1, further comprising:
a floating diffusion region of the first conductivity type; and
a second transfer electrode arranged on the first surface and configured to form, in the first semiconductor region, a channel for transferring the signal charge from the fourth semiconductor region to the floating diffusion region.

6. The apparatus according to claim 1, further comprising:
a ninth semiconductor region of the second conductivity type,
wherein the ninth semiconductor region overlaps at least a part of the first transfer electrode and does not overlap the third semiconductor region in a planar view.

7. A solid-state image sensor comprising:
a pixel unit in which pixels, each including a photoelectric conversion apparatus defined in claim 1, are arranged in a matrix;
a vertical scanning circuit configured to control the pixel unit to read out a signal from each pixel; and
a processing circuit configured to process the signal read out from the pixel.

8. A device that includes a photoelectric conversion apparatus defined in claim 1,
wherein the device further comprises at least one of
an optical apparatus corresponding to the photoelectric conversion apparatus;
a control apparatus configured to control the photoelectric conversion apparatus;
a processing apparatus configured to process a signal output from the photoelectric conversion apparatus;
a display apparatus configured to display information obtained by the photoelectric conversion apparatus;
a storage apparatus configured to store the information obtained by the photoelectric conversion apparatus; and
a mechanical apparatus configured to operate based on the information obtained by the photoelectric conversion apparatus.

9. A photoelectric conversion apparatus comprising:
a first semiconductor region of a first conductivity type arranged between a first surface and a second surface;
a second semiconductor region of the first conductivity type arranged between the first surface and the second surface and configured to accumulate a signal charge generated by incident light;
a third semiconductor region of the first conductivity type arranged between the first surface and the second surface;
a fourth semiconductor region of the first conductivity type arranged between the first surface and the second surface and is in contact with the third semiconductor region;
a fifth semiconductor region of a second conductivity type arranged between the fourth semiconductor region and the first surface;
a first transfer electrode arranged on the first surface and configured to form, in the first semiconductor region, a channel for transferring the signal charge accumulated in the second semiconductor region to the third semiconductor region;
a sixth semiconductor region of the second conductivity type arranged between the third semiconductor region and the second surface; and
an eighth semiconductor region of the second conductivity type arranged between the second and the sixth semiconductor regions and the second surface,
wherein the fourth semiconductor region does not overlap the sixth semiconductor region in a planar view, and the sixth semiconductor region and the eighth semiconductor region are electrically connected to each other.

10. The apparatus according to claim 9, wherein the eighth semiconductor region overlaps the second semiconductor region in a planar view.

11. The apparatus according to claim 9, wherein the effective amount of dopant ions per unit area for forming the sixth semiconductor region is not less than $5.5 \times 10^{11}/cm^2$ and not more than $1.2 \times 10^{12}/cm^2$.

12. The apparatus according to claim 9, further comprising a light-shielding membrane arranged on the first surface and configured to cover the fourth semiconductor region.

13. The apparatus according to claim 9, further comprising:
a floating diffusion region of the first conductivity type; and
a second transfer electrode arranged on the first surface and configured to form, in the first semiconductor region, a channel for transferring the signal charge from the fourth semiconductor region to the floating diffusion region.

14. The apparatus according to claim 9, further comprising:
a ninth semiconductor region of the second conductivity type,
wherein the ninth semiconductor region overlaps at least a part of the first transfer electrode and does not overlap the third semiconductor region in a planar view.

15. A solid-state image sensor comprising:
a pixel unit in which pixels; each including a photoelectric conversion apparatus defined in claim 9, are arranged in a matrix;
a vertical scanning circuit configured to control the pixel it to read out a signal from each pixel; and
a processing circuit configured to process the signal read out from the pixel.

16. A device that includes a photoelectric conversion apparatus defined in claim 9,
wherein the device further comprises at least one of
an optical apparatus corresponding to the photoelectric conversion apparatus;
a control apparatus configured to control the photoelectric conversion apparatus;
a processing apparatus configured to process a signal output from the photoelectric conversion apparatus;
a display apparatus configured to display information obtained by the photoelectric conversion apparatus;
a storage apparatus configured to store the information obtained by the photoelectric conversion apparatus; and
a mechanical apparatus configured to operate based on the information obtained by the photoelectric conversion apparatus.

17. A photoelectric conversion apparatus comprising:
a first semiconductor region of a first conductivity type arranged between a first surface and a second surface;
a second semiconductor region of the first conductivity type arranged between the first surface and the second surface and configured to accumulate a signal charge generated by incident light;
a third semiconductor region of the first conductivity type arranged between the first surface and the second surface;
a first transfer electrode arranged on the first surface and configured to form, in the first semiconductor region, a channel for transferring the signal charge accumulated in the second semiconductor region to the third semiconductor region; and
a semiconductor region of a second conductivity type which is arranged between the third semiconductor region and the second surface and overlaps at least a part of the third semiconductor region,
wherein the third semiconductor region and the first transfer electrode at least partially overlap each other in a planar view, and
an effective amount of dopant ions per unit area of the semiconductor region of the second conductivity type is not less than $5.5 \times 10^{11}/cm^2$ and not more than $1.2 \times 10^{12}/cm^2$.

18. The apparatus according to claim 17, further comprising:
a ninth semiconductor region of the second conductivity type,
wherein the ninth semiconductor region overlaps at least a part of the first transfer electrode and does not overlap the third semiconductor region in a planar view.

19. A solid-state image sensor comprising:
a pixel unit in which pixels, each including a photoelectric conversion apparatus defined in claim 17, are arranged in a matrix;
a vertical scanning circuit configured to control the pixel unit to read out a signal from each pixel; and
a processing circuit configured to process the signal read out from the pixel.

20. A device that includes a photoelectric conversion apparatus defined in claim 17,
wherein the device further comprises at least one of
an optical apparatus corresponding to the photoelectric conversion apparatus;
a control apparatus configured to control the photoelectric conversion apparatus;
a processing apparatus configured to process a signal output from the photoelectric conversion apparatus;
a display apparatus configured to display information obtained by the photoelectric conversion apparatus;
a storage apparatus configured to store the information obtained by the photoelectric conversion apparatus; and
a mechanical apparatus configured to operate based on the information obtained by the photoelectric conversion apparatus.

* * * * *